(12) United States Patent
Kim et al.

(10) Patent No.: US 7,507,987 B2
(45) Date of Patent: Mar. 24, 2009

(54) METHOD OF MAKING PACKETS OF NANOSTRUCTURES

(75) Inventors: Sang-Gook Kim, Wayland, MA (US); Tarek A. El Aguizy, Cambridge, MA (US); Jeung-hyun Jeong, Cambridge, MA (US); Yongbae Jeon, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/683,511

(22) Filed: Oct. 9, 2003

(65) Prior Publication Data

US 2004/0137730 A1 Jul. 15, 2004

Related U.S. Application Data

(60) Provisional application No. 60/417,959, filed on Oct. 11, 2002.

(51) Int. Cl.
*H01L 29/06* (2006.01)
*D02G 3/00* (2006.01)

(52) U.S. Cl. .................. 257/10; 438/20; 428/336; 428/378; 428/392; 977/762; 977/939; 977/962

(58) Field of Classification Search ............ 257/787, 257/798, 9–10, 26–27; 977/DIG. 1, 762, 977/778–779, 785, 939, 962; 438/20, 962; 428/323, 332, 336, 378, 391–392
See application file for complete search history.

(56) References Cited

U.S. PATENT DOCUMENTS

| 5,264,722 | A | * | 11/1993 | Tonucci et al. | 257/443 |
| 5,292,689 | A | * | 3/1994 | Cronin et al. | 438/435 |
| 5,380,546 | A | * | 1/1995 | Krishnan et al. | 427/126.1 |
| 5,899,734 | A | * | 5/1999 | Lee | 438/584 |
| 6,464,853 | B1 | * | 10/2002 | Iwasaki et al. | 205/118 |
| 6,504,292 | B1 | * | 1/2003 | Choi et al. | 313/310 |
| 6,545,396 | B1 | * | 4/2003 | Ohki et al. | 313/309 |

(Continued)

FOREIGN PATENT DOCUMENTS

EP 1 022 763 A1 1/2000

(Continued)

OTHER PUBLICATIONS

Choi et al., Fully sealed, high-brightness carbon-nanotube field-emission display, *Appl. Phys. Lett.*, 75 (Nov. 1999) 3129.*

(Continued)

*Primary Examiner*—Douglas M Menz
*Assistant Examiner*—Matthew W Such
(74) *Attorney, Agent, or Firm*—Daly, Crowley, Mofford & Durkee, LLP

(57) ABSTRACT

A method for making packets of nanostructures is presented. The method includes etching trenches in a silicon substrate. Nanostructures are grown in the trenches. The trenches are then filled with a filler material. Any filler and/or nanostructures material extending beyond the trench is removed. The silicon substrate is etched away, resulting in a nanopellet surrounding the nanostructures and wherein each nanostructures has a generally uniform length and direction. Nanostructures can comprise nanotubes, nanowires and nanofibers. The method eases the manipulation of nanostructures while providing geometrical uniformity.

10 Claims, 8 Drawing Sheets

U.S. PATENT DOCUMENTS

| | | | |
|---|---|---|---|
| 6,566,704 B2 * | 5/2003 | Choi et al. ................. 257/314 |
| 6,628,053 B1 * | 9/2003 | Den et al. ................... 313/310 |
| 6,737,939 B2 * | 5/2004 | Hoppe et al. ................ 333/186 |
| 6,740,910 B2 * | 5/2004 | Roesner et al. ............. 257/213 |
| 6,831,017 B1 * | 12/2004 | Li et al. ...................... 438/694 |
| 6,838,297 B2 * | 1/2005 | Iwasaki et al. ............... 438/20 |
| 6,866,801 B1 * | 3/2005 | Mau et al. ................... 264/29.1 |
| 6,882,051 B2 * | 4/2005 | Majumdar et al. .......... 257/746 |
| 7,077,939 B1 * | 7/2006 | Crooks et al. ............... 204/450 |
| 2002/0163079 A1 * | 11/2002 | Awano ........................ 257/750 |
| 2003/0020060 A1 * | 1/2003 | Iwasaki et al. ................ 257/13 |
| 2003/0052585 A1 * | 3/2003 | Guillorn et al. ............. 313/311 |
| 2003/0096104 A1 * | 5/2003 | Tobita et al. ................. 428/332 |
| 2003/0178617 A1 * | 9/2003 | Appenzeller et al. .......... 257/20 |
| 2003/0179559 A1 * | 9/2003 | Engelhardt et al. .......... 361/780 |
| 2003/0211724 A1 * | 11/2003 | Haase ......................... 438/629 |
| 2004/0071951 A1 * | 4/2004 | Jin .............................. 428/323 |

FOREIGN PATENT DOCUMENTS

| | | | |
|---|---|---|---|
| WO | WO 0211216 A1 * | 2/2002 |
| WO | WO 02/059392 A1 | 8/2002 |
| WO | WO 02/100931 A1 | 12/2002 |

OTHER PUBLICATIONS

Gröning et al., Properties and characterization of chemical vapor deposition diamond field emitters, *Solid-State Electronics*, 45 (2001) 929.*

Li et al., Bottom-up approach for carbon nanotube interconnects, *Appl. Phys. Lett.*, 82 (Apr. 2003) 2491.*

Lee et al., Fabrication of flexible field emitter arrays of carbon nanotubes using self-assembly monolayers, *Appl. Phys. Lett.*, 82 (May 2003) 3770.*

Database Online, "Method for Manufacture of Switching Devices by Selective Growth of Carbon Nanotubes" XP-002270461, Abstract, dated Jan. 14, 1999.

International Search Report for PCT/US03/32109 dated Mar. 1, 2004.

* cited by examiner

METHOD OF MAKING PACKETS OF NANOSTRUCTURES

CROSS REFERENCE TO RELATED APPLICATIONS

This application claims priority under 35 U.S.C. §119(e) to provisional application Ser. No. 60/417,959 filed Oct. 11, 2002, the disclosure of which is hereby incorporated by reference.

STATEMENT REGARDING FEDERALLY SPONSORED RESEARCH

Not Applicable.

FIELD OF THE INVENTION

The present invention relates generally to carbon nanotubes and other nanostructures and more particularly to a method of providing nanostructure building blocks containing packets of nanostructures, known as nanopellets.

BACKGROUND OF THE INVENTION

As is known in the art, there has been a trend to develop materials at the nanoscale level. Manufacturing of nanoscale level devices is a challenge that needs to be addressed before the potential of nanotechnology becomes a reality. Manufacturing is defined as the transformation of materials and information into goods for the satisfaction of customer needs. Conventional manufacturing strives to produce goods in large volume with high quality, fast production rate, low cost and reasonable flexibility to accommodate the varying requirements of the customers. These attributes are equally applicable to the manufacturing of nanoscale products.

One type of nanoscale product comprises carbon nanotubes (CNTs). A carbon nanotube can be thought of as a hexagonal network of carbon atoms that has been rolled up to make a seamless cylinder. The cylinder can be tens of microns long, and each end is "capped" with half of a fullerene molecule. Single-wall nanotubes (SWNTs) can be thought of as the fundamental cylindrical structure, and these SWNTs form the building blocks of both multi-wall nanotubes and ordered arrays of single-wall nanotubes called ropes.

One method of forming a carbon nanotube comprises taking a sheet of graphite and reducing the size of the sheet such that the sheet becomes an extremely narrow strip of material. At a width of approximately 30 nanometers the strip curls about a lengthwise axis and the opposing carbon bonds at the side edges of the strip join to form a tube approximately 10 nanometers in diameter. Thinner tubes having a diameter of between 10 nanometers and 5 nanometers can be formed in the same manner. It is also possible to produce multiwall carbon nanotubes (MWNTs) by curving a number of sheets of graphite (typically 3 to 8 sheets) in a similar manner as forming a single wall carbon nanotube.

CNTs may also be prepared by laser vaporization of a carbon target in a furnace at approximately 1200° C. A cobalt-nickel catalyst helps the growth of the nanotubes because the catalyst prevents the ends of the CNTs from being "capped" during synthesis, and about 70-90% of the carbon target can be converted to single-wall nanotubes. While multi-wall carbon nanotubes do not need a catalyst for growth, single-wall nanotubes are preferably grown with a catalyst.

A carbon-arc method to grow arrays of SWNTs has also been developed. In this method, ordered nanotubes are produced from ionized carbon plasma, and joule heating from the discharge generated the plasma. In a scanning electron microscope (SEM), the nanotube material produced by either of these methods looks like a mat of carbon ropes. The ropes are between 10 and 20 nm across and up to 100 µm long. When examined in a transmission electron microscope (TEM), each rope is found to be comprised of a bundle of single-wall carbon nanotubes aligned along a single direction. X-ray diffraction, which views many ropes at once, shows that the diameters of the single-wall nanotubes have a narrow distribution with a strong peak.

The unique electronic properties of carbon nanotubes are due to the quantum confinement of electrons in a direction which is normal to the direction of a central longitudinal axis of the nanotube. In the radial direction, electrons are confined by the monolayer thickness of the graphite sheet. Around the circumference of the nanotube, periodic boundary conditions come into play. Because of this quantum confinement, electrons can only propagate along the nanotube axis, and so their wavevectors point in this direction. The resulting number of one-dimensional conduction and valence bands effectively depends upon the standing waves that are set up around the circumference of the nanotube.

The density of electronic states as a function of energy has been calculated for a variety of nanotubes. While conventional metals have a relatively smooth density of states, nanotubes are characterized by a number of singularities, where each peak corresponds to a single quantum subband. These singularities are important when interpreting experimental results, such as measurements obtained from scanning tunneling spectroscopy and resonant Raman spectra, the two techniques that have contributed the most to understanding the one-dimensionial properties of nanotubes.

A nanotube may be either metallic or semiconducting, however the chemical bonding between the carbon atoms is the same in both cases. This is due to the very special electronic structure of a two-dimensional graphite sheet, which is a semiconductor with a zero band gap. In this case, the top of the valence band has the same energy as the bottom of the conduction band, and this energy equals the Fermi energy for one special wavevector, the so-called K-point of the two-dimensional Brillouin zone (i.e. the corner point of the hexagonal unit cell in reciprocal space). A nanotube becomes metallic when one of the few allowed wavevectors in the circumferential direction passes through this K-point.

As the nanotube diameter increases, more wavevectors are allowed in the circumferential direction. Since the band gap in semiconducting nanotubes is inversely proportional to the tube diameter, the band gap approaches zero at large diameters, just as for a graphene sheet. At a nanotube diameter of about 3 nm, the band gap becomes comparable to thermal energies at room temperature.

Calculations show that concentric pairs of metal-semiconductor and semiconductor-metal nanotubes are stable. Nanometer-scale devices could therefore be based on two concentric nanotubes or the junction between nanotubes. For example, a metallic inner tube surrounded by a larger semiconducting (or insulating) nanotube would form a shielded cable at the nanometer scale. One might then envisage nanoscale electronic devices made completely from carbon that would combine the properties of metals and semiconductors, without the need for doping.

Since nanotubes are typically a few microns long, electrical contacts can be made by modern lithographic techniques. Single-wall carbon nanotubes thus provide a unique system for studying single-molecule transistor effects, in which an electrode close to the conducting nanotube is used to modulate the conductance. Another area of research is focused on the mechanical properties of carbon nanotubes. By analogy to graphite and carbon fibers, nanotubes are very strong and have high elastic moduli. Single-wall carbon nanotubes are also very strong and resist fracture under extension, just as the carbon fibers commonly used in aerospace applications. A nanotube can be elongated by several percent before it fractures. Unlike carbon fibers, however, single-wall nanotubes are remarkably flexible. They can be twisted, flattened and bent into small circles or around sharp bends without breaking, and severe distortions to the cross-section of nanotubes do not cause them to break.

Another advantage of nanotubes is their behavior under compression. Unlike carbon fibers, which fracture easily under compression, carbon nanotubes form kink-like ridges that can relax elastically when the stress is released. As a result, nanotubes not only have the desirable properties of carbon fibers, but are also much more flexible and can be compressed without fracture. The mechanical properties of carbon nanotubes would make them ideal for manipulating other nanoscale structures. Many of the applications now being considered involve multi-wall nanotubes, partly because they have been available for much longer, and partly because many of these applications do not explicitly depend on the one-dimensional quantum effects found mainly in single-wall nanotubes.

In the same way that carbon fibers are used in composites to strengthen a structure or to enhance the electrical conductivity of the main constituent, carbon nanotubes can be combined with a host polymer (or metal) to tailor their physical properties to specific applications. Since carbon nanotubes are so small, they can be used in polymer composites that are formed into specific shapes, or in a low-viscosity composite that is sprayed onto a surface as a conducting paint or coating.

Carbon nanotubes could also be used in displays or for the tips of electron probes. Other applications could result from the fact that carbon nanotubes can retain relatively high gas pressures within their hollow cores.

Several efforts have been made to grow nanotubes into patterned configurations (e.g., arrays), however the resulting arrays typically include several nanotubes that are irregularly spaced and have varying heights. Other efforts have shown that the growth of aligned nanotubes in several directions can be controlled in a single process. Though the functional feasibility to integrate nanostructures into micro-devices has been demonstrated by growing them into patterns, process couplings and scale mismatches between nano- and microfabrication processes limit the practical production of integrated devices. It has been stated that growing a uniform length nanotube-tip-array on 1 $cm^2$ area would be equivalent to growing a perfectly healthy and uniform length grass lawn on 1,000 acres.

There have been few efforts regarding the handling and manufacturing of carbon nanotubes. One group has worked on the directed assembly of one-dimensional nanostructures into functional networks by fluidic assembly with a surface-patterning technique. Another research group developed a method of assembling single-walled CNTs into long ribbons and fibers. In this method the nanotubes are dispersed in surfactant solution and then the nanotubes are recondensed in the flow of a polymeric solution to form a nanotube fiber. Companies are selling commercial quantities of nanotubes in the form of soot, which cannot be handled effectively during the subsequent manufacturing processes. Other companies are working on flat panel displays using carbon nanotubes as emission tips. None of theses companies have reported commercially viable manufacturing solutions for the mass production of nanotubes.

As described above, there exists several potential applications using nanotubes, however widescale use of nanotubes will only become feasible if massive production of carbon nanotubes becomes a reality.

SUMMARY OF THE INVENTION

A device comprising a packet of nanostructures (collectively referred to as nanostructures) and a method for making the same is presented. The device, referred to as a nanopellet, comprises from one to several hundred uniform-length nanostructures disposed in a block of dielectric material. The method for manufacturing the nanopellets includes etching trenches in a silicon substrate. Nanostructures are grown in the trenches. The trenches are then filled with a filler material. Feasible filler materials include, for example, spin-on-glass, CVD deposited TEOS $SiO_2$, and polymers. Any filler material and/or nanotube material extending beyond the trench is removed. The remaining silicon is etched away, resulting in a nanopellet surrounding the nanostructures. The resulting nanopellets can be transplanted and assembled into substrates for particular applications and the filler material removed, resulting in an array of nanotubes having uniform length and spacing.

BRIEF DESCRIPTION OF THE DRAWINGS

The invention will be more fully understood from the following detailed description taken in conjunction with the accompanying drawings, in which.

DETAILED DESCRIPTION OF THE INVENTION

Carbon nanotubes and other nanostructures such as nanowires and nanofibers, can be used to produce devices such as single-electron transistors, flat panel displays, nanolithography systems, and many biological applications. In order to produce large quantities of such devices, however, the nanostructures need to be manufactured into physical devices with high yield, fast rate, and low cost. Nanopellets, a new concept of nanostructure building blocks in microscale, contain well-grown nanotubes frozen-in place with the nanotubes having a uniform length and alignment. Nanopellets can similarly contain any other nanostructure, e.g. nanowires and nanofibers, with this same method applying to those structures. Accordingly, while the use of nanotubes is described, it should be appreciated that the same concepts apply to other nanostructures such as nanowires and nanofibers, and that the present invention should not be limited to only using nanotubes. Nanopellets are easily positioned by micro-electromechanical systems (MEMS) manipulators or self-assembly methods such as fluidic or vibrational. Once the nanopellets are positioned, the bulk of the nanopellets is then released to expose the nanotubes. One application is a carbon nanotube emission-tip array uniformly spaced over a large substrate, which will enable commercialization of field-emitting displays, multi-e-beam writers and massively parallel Scanning Probe Microscopy (SPM) tips.

Figure 1:
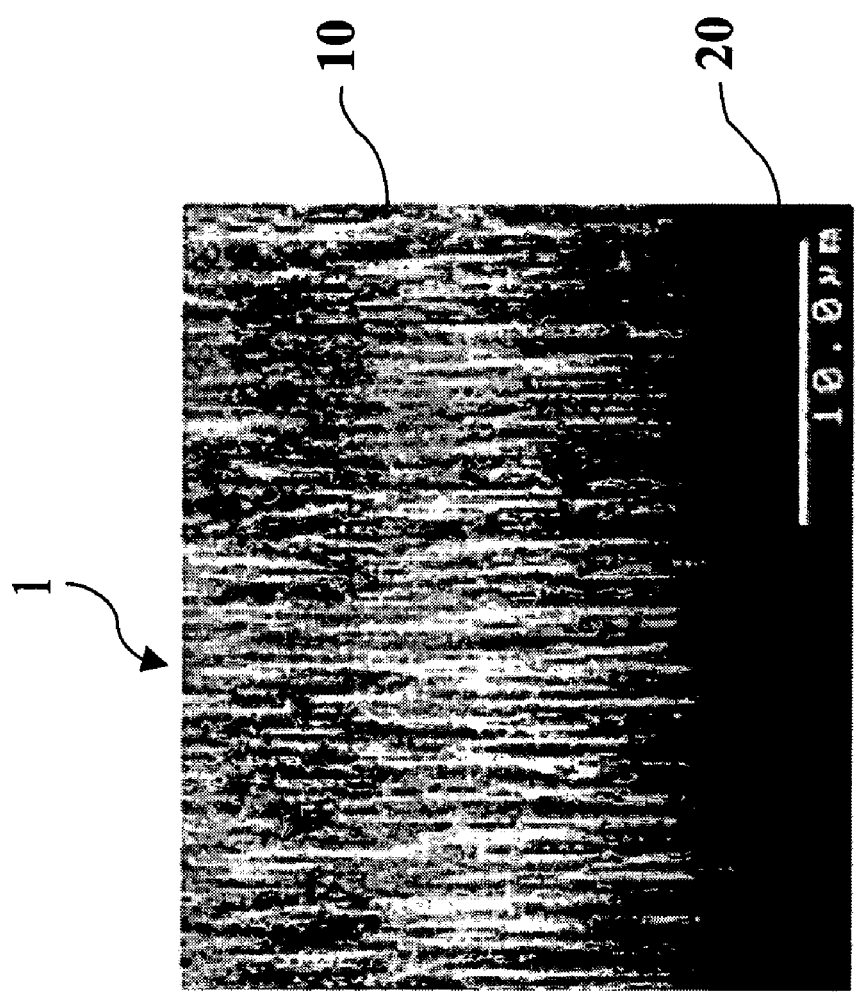
FIG. 1 is a picture of a prior art vertically aligned array of nanotubes.

Referring to FIG. 1, a prior art array of nanotubes 1 is shown. In this embodiment chemical-vapor deposition (CVD) has been used to grow vertically aligned nanotubes 10 on a catalyst-printed substrate 20. It can be seen that the nanotubes 10 have different heights and may be irregularly spaced.

Figure 2:
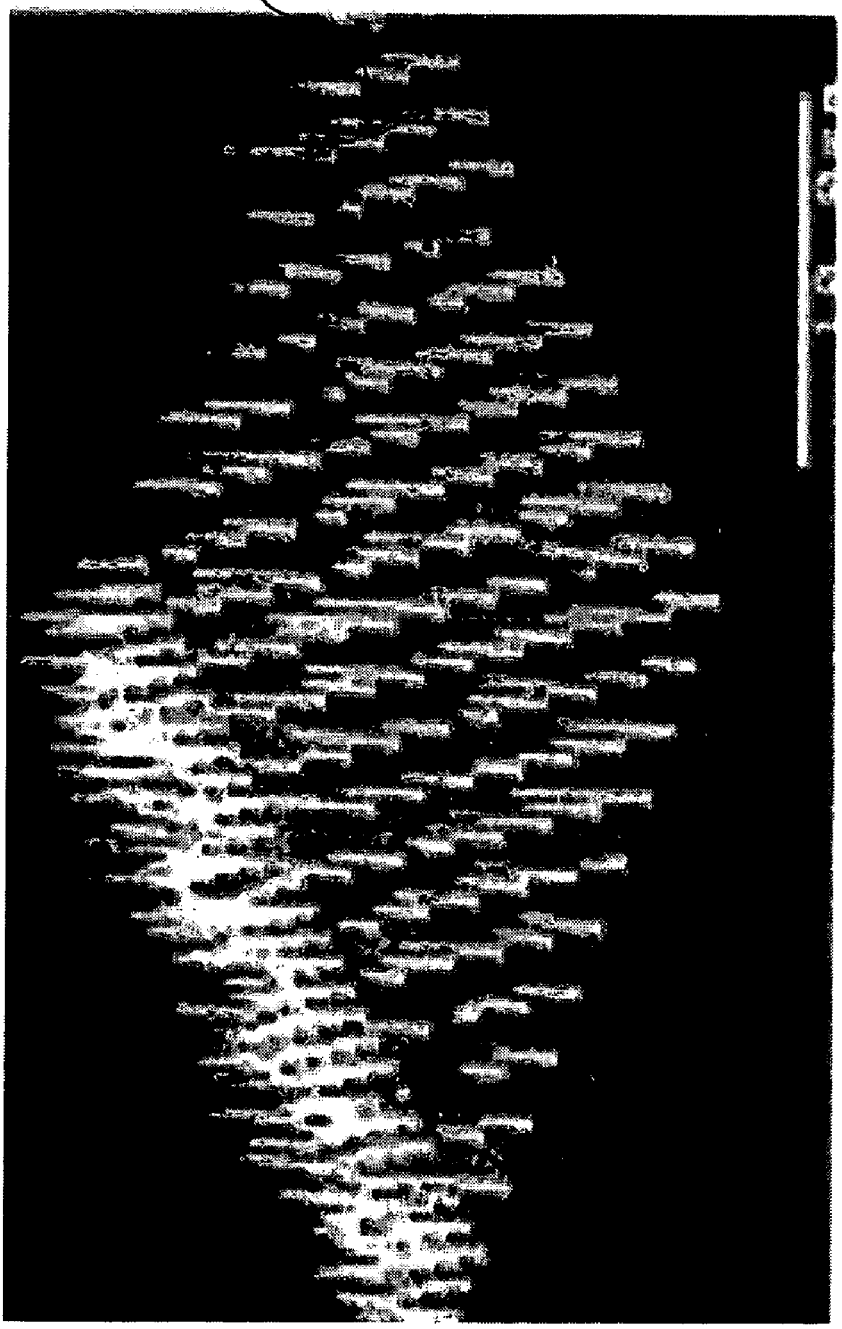
FIG. 2 is a picture of a prior art portion of an array of single-strand nanotubes.

Referring now to FIG. 2, a prior art picture 100 showing the tips of several freestanding nanotubes 240 are shown. As can be seen from the picture, the length of the tips of the nanotubes is non-uniform.

Figure 3:
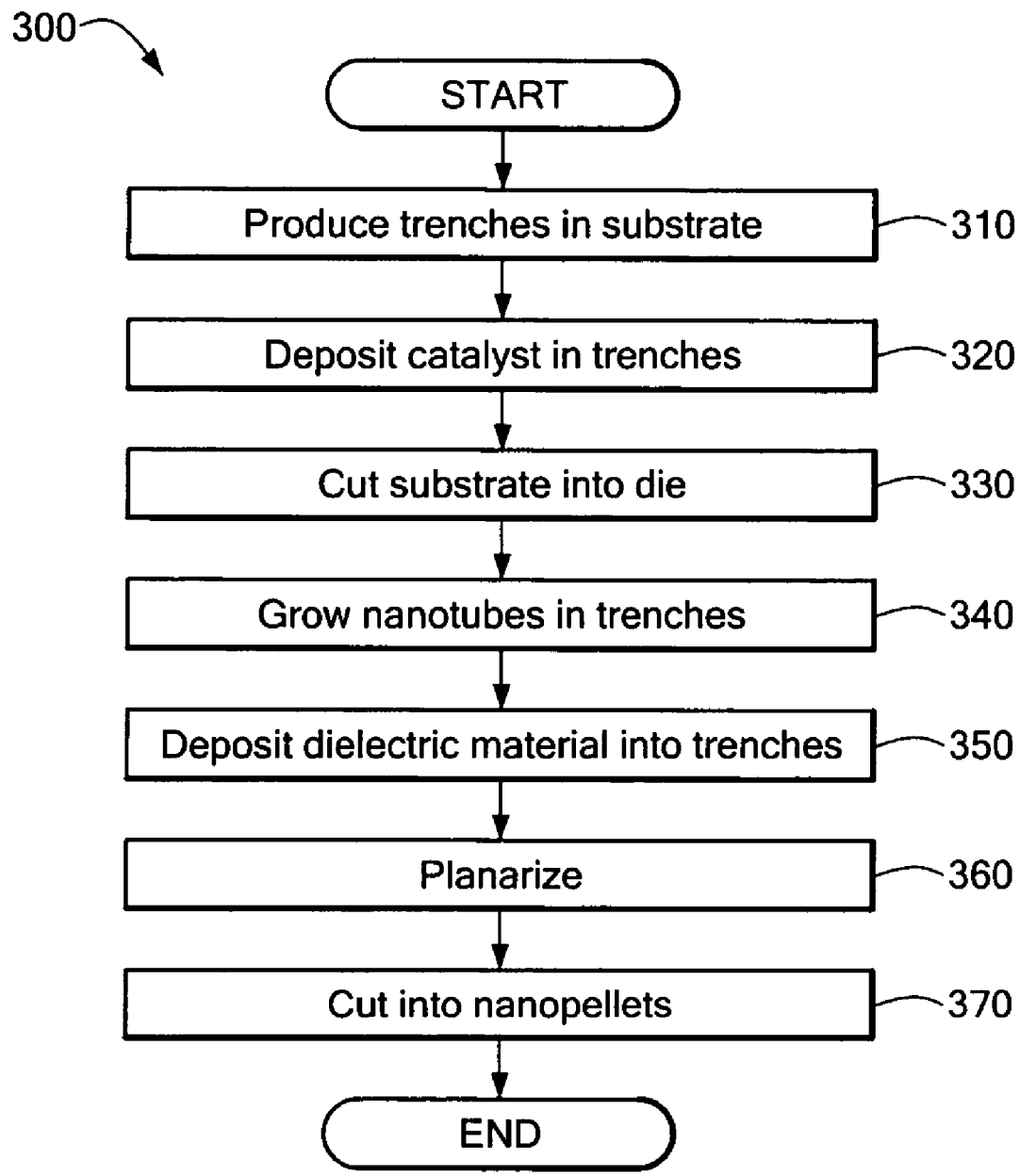
FIG. 3 is a flowchart for the process of forming a nanopellet.

A flow chart of the presently disclosed method is depicted in FIG. 3. The rectangular elements are herein denoted "processing blocks". It will be appreciated by those of ordinary skill in the art that unless otherwise indicated herein, the particular sequence of steps described is illustrative only and can be varied without departing from the spirit of the invention. Thus, unless otherwise stated the steps described below are unordered meaning that, when possible, the steps can be performed in any convenient or desirable order.

Referring now to FIG. 3, a flow chart of the present process for formulating nanopellets is shown. The process 300 begins with step 310 wherein one or more trenches are etched into a substrate. The depth of the trench is controlled, as this depth will correspond to the length of the nanotubes, or nanostructure, within the nanopellet.

In step 320 the catalyst for growing the nanotubes is deposited in the trenches. The catalyst may be nickel or other suitable material whose size is different depending on the application.

In step 330 the substrate is cut into individual die. This is done so that the die can fit into the processing equipment.

In step 340 nanotubes are grown on the die. The resulting nanotubes may be either single wall carbon nanotubes or multiwall carbon nanotubes. The nanotube growth is not uniform, as some nanotubes will be longer than other nanotubes. All the nanotubes however will extend beyond the top surface of the die substrate.

In step 350 a dielectric such as glass or epoxy polymer is fed into the trenches and surrounds the nanotubes. This is done to "freeze" the nanotubes into a fixed position within the trench.

In step 360 the die are planarized using chemical mechanical polishing. This results in the top surface of the die being smooth, such that all the nanotubes have the same height.

In step 370 the substrate is removed in order to obtain individual nanopellets.

Referring now to FIGS. 4A-4G, the process 200 for manufacturing nanotubes using a dielectric block is shown. A substrate 220 is provided from a conventional silicon wafer. While a silicon substrate is described, it should be appreciated that other material such as quartz, copper and the like could be used as the substrate. Substrate trenches, which can vary in size, are formed using conventional wafer processing techniques, among which are reactive ion etching or potassium hydroxide (KOH) preferential etching. An etch mask is prepared using photolithography resist or silicon nitride as appropriate 210 and is disposed over a top surface of the substrate 220.

Figure 4A:
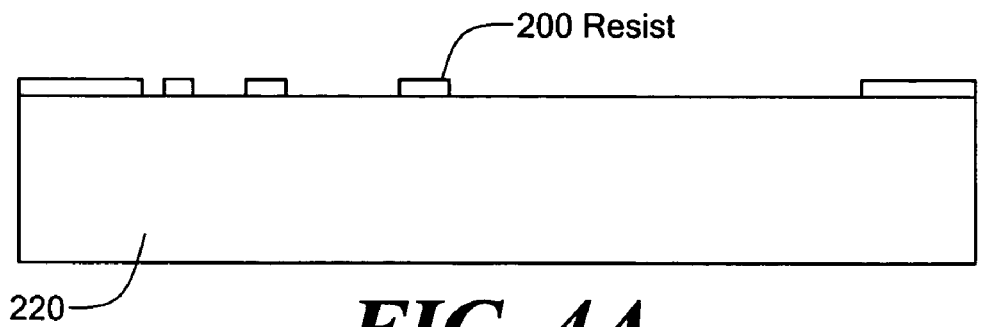
FIGS. 4A-4G are diagrams of the processing steps for fabricating nanopellets.
Figure 4B:
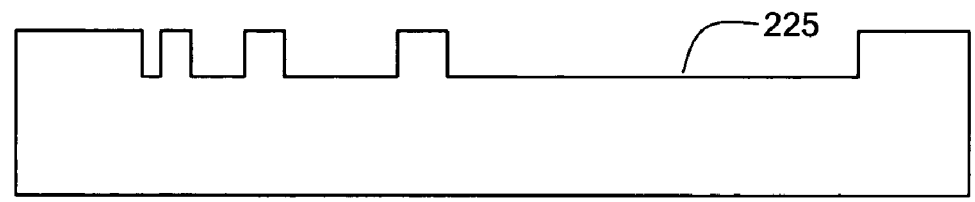

As shown in FIG. 4B, trenches 225 are etched into the substrate 220 using conventional etching technology like reactive ion etching, deep reactive ion etching, wet etching, etc. The resulting trenches have depths of several micron to tens of micron in a preferred embodiment, though other trench depths could also be utilized.

Figure 4C:
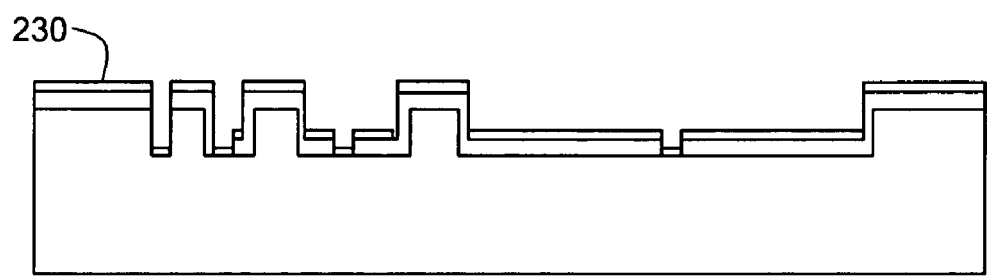
Figure 4D:
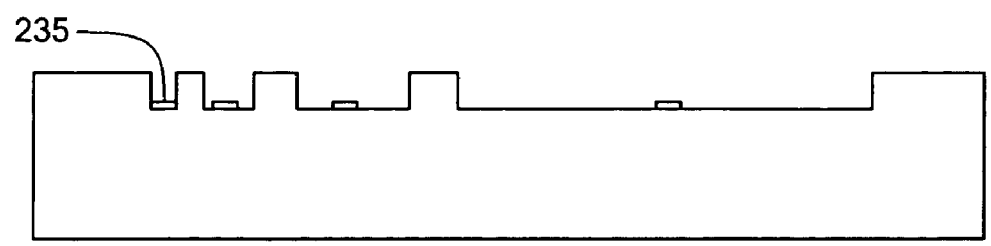

Referring now to FIG. 4C, a second resist mask 230 is deposited and patterned over portions of the substrate and a catalyst is then deposited. To create such catalysts, a layer of nickel or cobalt or iron or their oxide/alloy of varying thicknesses from several to tens of nanometers is deposited using e-beam evaporation, or sputtering. after the lithography of the mask 230. The resist layer is removed via a lift-off process to leave patterned catalysts 235 at the bottom of trenches 225 as shown in FIG. 4D.

Figure 4E:
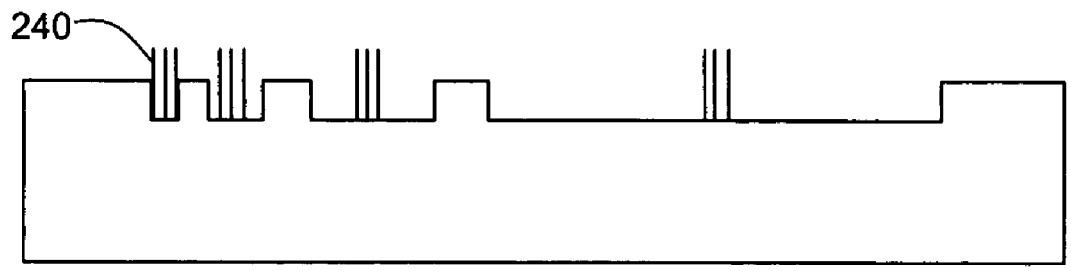

The substrate is then cut using a die saw into smaller pieces that fit into an existing (CVD) machine. The CVD process uses a mixture of carbon source gas like acetylene, ethylene, and methane and dilution gas like ammonia, nitrogen, and hydrogen at a pyrolytic temperature. Carbon nanotubes 240 are grown on the catalysts 235 at the center of each Si trench 225 as shown in FIG. 4E. CNT growth for each will yield nanotubes 240 longer than the height of Si trenches 225.

Figure 4F:
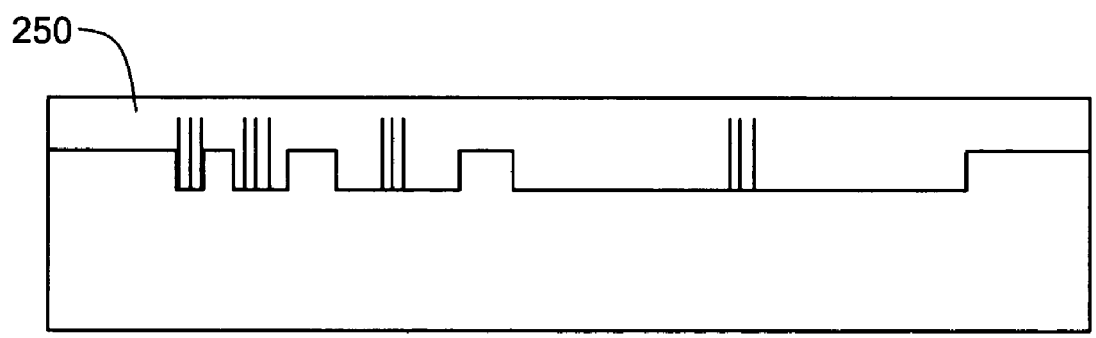

Following the nanotube growth, a filler material 250 is cast onto the substrates as shown in FIG. 4F. It should be appreciated that various materials (e.g., organic epoxy, spin-on glass, etc.) can be used as the filler material. The filler material 250 is either poured or spun on in liquid form, and is cured to form a solid material fully coating and rising higher than the substrate 220.

In one embodiment, following the nanotube growth, spin on glass (SOG), a common dielectric material being widely used to form very thin layers in integrated circuits, is cast onto the substrates. Though this glass resin is normally spin-coated onto the flat surface, SOG will be poured into the trenches in order to avoid the flow induced deformation of nanotubes by the centrifugal forces during spinning. The resin is diluted in ethyl acetate to achieve a low-enough viscosity for a uniform film. The substrates and solution are pumped in a vacuum chamber to dry and degas. The resin is then heat treated to cure the resin and drive off any remaining solvent. Curing temperature are ramped slowly up to around 200° C. and held for several hours. The substrates are planarized using chemical mechanical polishing. After the CMP process, the substrates are cut into nanopellets. The glass resin is later removed using vapor HF etching.

Figure 4G:
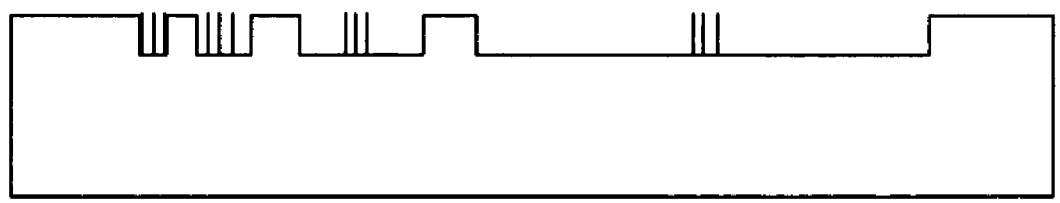

The substrates are planarized using chemical mechanical polishing (CMP) as shown in FIG. 4G. The planarization process results in all the nanotubes having substantially uniform length. After the CMP process, the substrate is removed leaving a block of the filler material embedding one or more nanotubes extending therein from the top surface to the bottom surface of the block. As shown in FIG. 4G, the trenches have a height H and a length L, and the height H can be varied from several microns to tens of micron, while the length L can be between several microns to hundreds of microns, depending on the specific application. Also, depending on the etching method utilized, the trenches will have tapered walls ranging from vertically oriented to having an angle of approximately 54 degrees from horizontal.

Referring now to FIGS. 5A-5D the process for forming released nanopellets is shown. As described with respect to FIG. 4, the substrates are etched and a plurality of carbon nanotubes (SWNTs or MWNTs) 10 are vertically grown on patterned catalyst patches 15 at the bottom of the trenches 12 on a silicon substrate 20. The sizes of catalyst patches 15 governs having a single CNT or bundled CNTs 10 grown on inside the trenches 12. The resulting NTs 10 have varying heights.

Figure 5A:
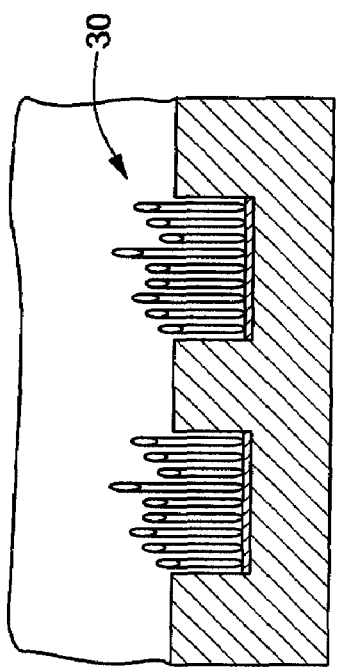
FIGS. 5A-5D are diagrams of the process used to form the nanopellets.
Figure 5B:
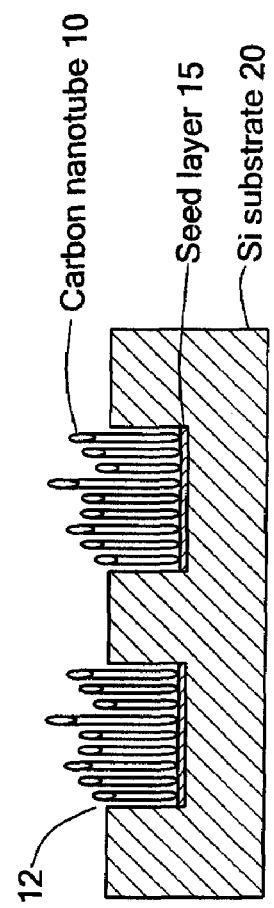

Next, as shown in FIG. 5B and as also described with respect to FIG. 4, a filler material 30 is cast/spun to fill the trenches 12. The filler material 30 not only fills the trenches 12 around the CNTs 10 but also extends above the surface of the substrate 20, thereby fixing the portions of the NTs extending beyond the surface of the substrate 20.

Figure 5C:
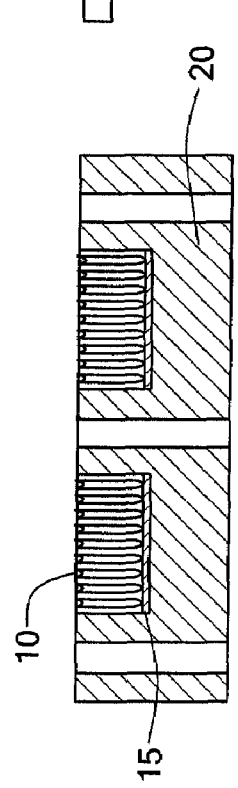

Excessive filler material removal is performed next, which leaves uniform-length nanotubes inside of the trenches as shown in FIG. 5C, while the depth of Si trenches controls the length of the nanotubes.

Figure 5D:
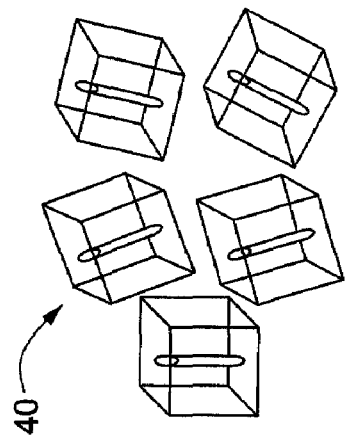

As shown in FIG. 5D, the silicon substrate is removed by etching, which produces nanopellets 40 with embedded nanotubes inside. These nanopellets 40 can then be self-assembled onto acceptor substrates by fluidic or vibrational self-assembly, or position-assembled by MEMS manipulators to produce devices.

Figure 6B:
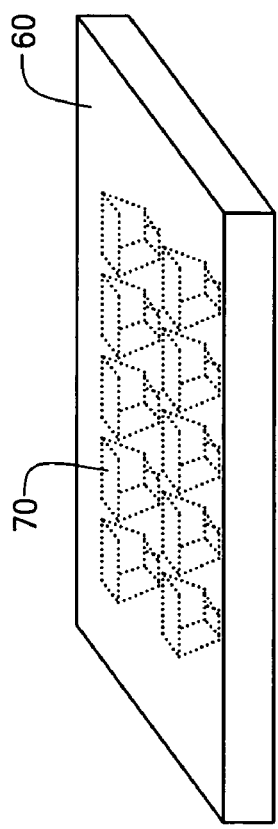
FIGS. 6A-6D are diagrams of the formation of a nanotube array by transplanting nanopellets.
Figure 6C:
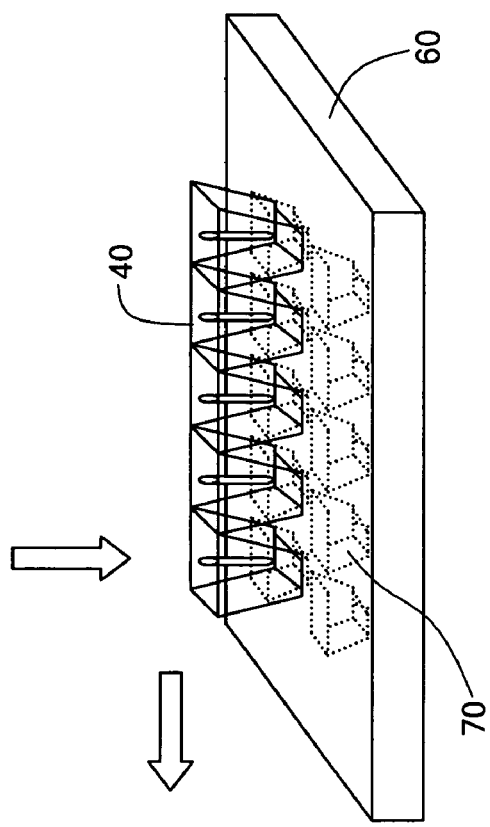
Figure 6A:
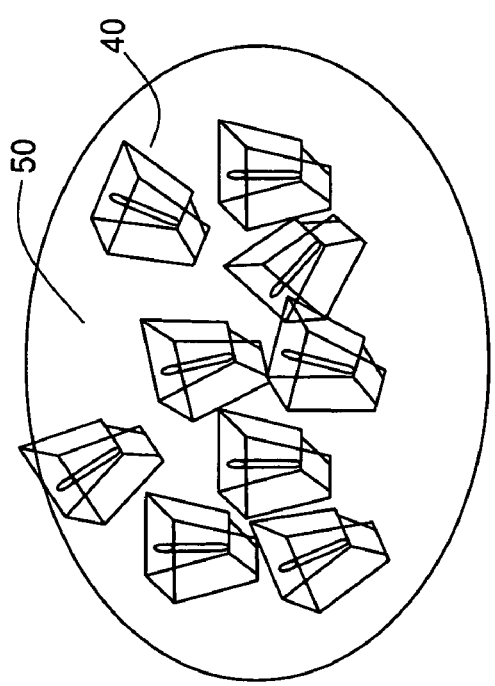

One application for using nanopellets is to provide uniformly spaced carbon nanotubes field emitters over a large area substrate, and is shown in FIGS. 6A-6D. The resulting array can be used for flat panel displays, multi-e-beam writers and massive parallel SPM tips. As shown in FIG. 6A, the nanopellets 40 are suspended in liquid 50, which is only the case for fluidic self-assembly.

As shown in FIG. 6B, the array base 60 includes a plurality of trapezoidal holes 70 for receiving nanopellets 40. The number of holes is dependent upon the application. While trapezoidal holes are shown, it should be understood that any shape holes could be used, as long as the holes match the corresponding shape of the nanopellets.

In FIG. 6C, the nanopellets 40 are self-assembled into the holes 70 of the array base 60. Nanopellets can be rapidly assembled into the matching holes on a large substrate with the fluidic self-assembly technique described or by other self-assembly methods such as vibrational assembly.

Figure 6D:
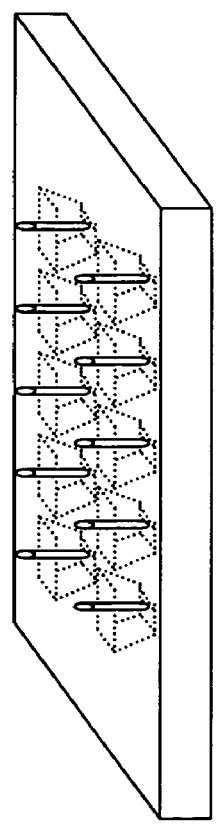

In FIG. 6D, the nanopellets are bonded to the substrate, and then by releasing the filler material of the nanopellets, the carbon nanotubes are exposed. The carbon nanotubes have uniform length and spacing over a large surface area, which has not been possible before.

Figure 7:
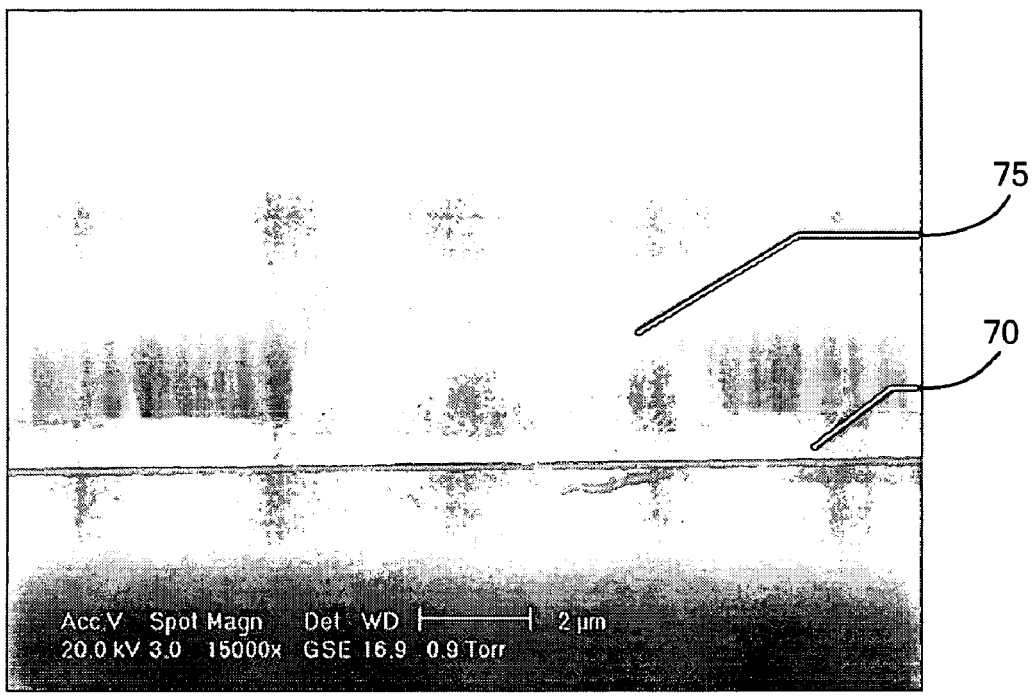
FIG. 7 is a picture of nanotubes which have undergone processing and are trimmed to a uniform length.

Referring now to FIG. 7, the nanotubes 75 are shown standing atop the substrate 70, and are trimmed to specified length.

Figure 8:
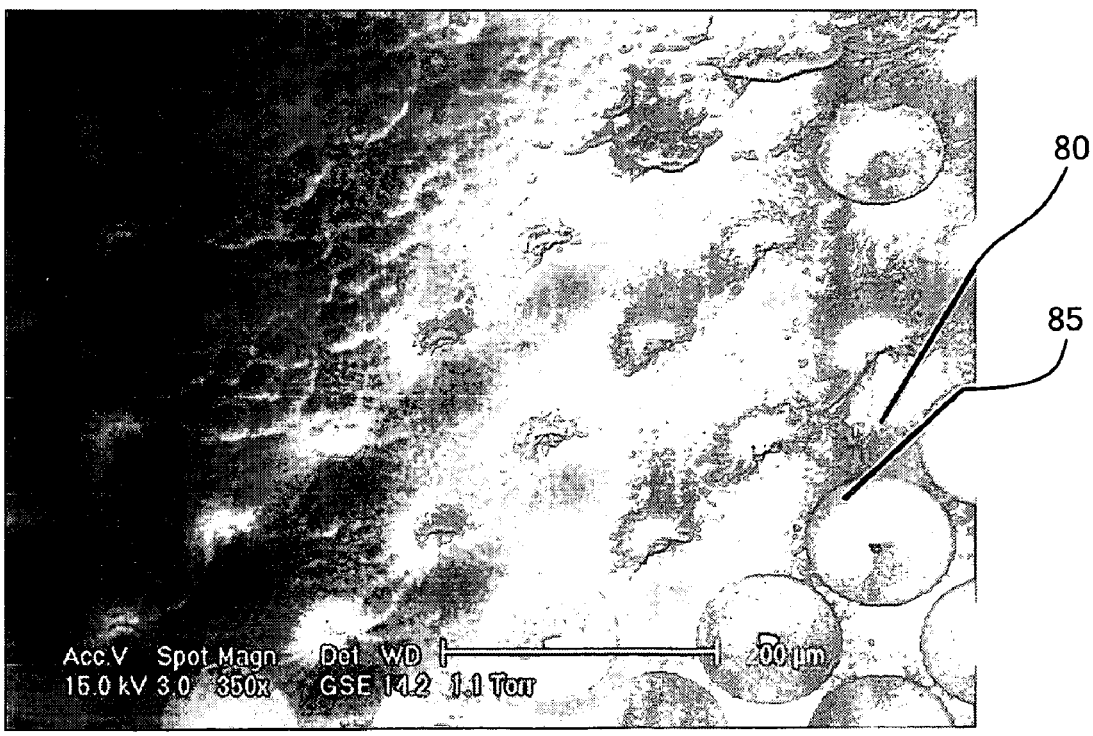
FIG. 8 is a picture of nanopellets atop a substrate after the substrate has been removed and the pellets are free to be positioned.

Referring now to FIG. 8, the nanopellets 85 are shown sitting on a silicon substrate 80 which has been removed from beneath the nanopellets.

The nanopelleting concept described above decouples the growing process of carbon nanotubes, or of a general nanostructure, from the device fabrication processes. It also mitigates the scale mismatch between micro and nano processes. Therefore, nanopelleting is a technology to transform carbon nanotubes specifically, and other nanostructures generally, into a more manageable and manufacturable form with which existing micro-scale manufacturing technologies can be utilized, such as fluidic self-assembly or MEMS manipulators. Potential applications will become commercially valuable by the massive production of them with nanopellets. Nanopellets can be used for the massive parallel production of single-electron transistors, near field nanolithography systems, and flat panel displays among many other applications.

Having described preferred embodiments of the invention it will now become apparent to those of ordinary skill in the art that other embodiments incorporating these concepts may be used. Accordingly, it is submitted that the invention should not be limited to the described embodiments but rather should be limited only by the spirit and scope of the appended claims. All publications and references cited herein are expressly incorporated herein by reference in their entirety.

What is claimed is:

1. A device comprising:
   a silicon substrate having first and second opposing surfaces, with the first surface having a trench provided therein, the trench having a base surface which corresponds to a bottom of the trench and wherein a depth of the trench is defined as a distance between the base surface of the trench and the first surface of the substrate;
   a catalyst disposed at a first location on the base surface of the trench;
   at least one nanostructure disposed in said trench such that each of said at least one nanostructures projects from the base surface of the trench at the first location with each of said at least one nanostructures having a length at least equal to the depth of the trench; and
   a quantity of dielectric filler material disposed in said trench and such that each of said at least one nanostructure is entirely embedded in said quantity of dielectric filler material and such that said quantity of dielectric filler material holds each of said at least one nanostructures in a fixed position within said trench.

2. The device of claim 1 wherein each of said at least one nanostructures extends from a bottom surface of the quantity of dielectric filler material to a top surface of the quantity of dielectric filler material.

3. The device of claim 2 wherein said quantity of dielectric filler material is selected such that in response to an etching process, the silicon substrate is etched away to form a nanopellet.

4. The device of claim 2 wherein the quantity of filler material further comprises a separable portion of filler material, the separable portion of filler material being disposed outside of the trench and apart from the substrate, the separable portion of filler material embedding and holding fixed therein a second nanostructure having a length approximately equal to the depth of the trench, wherein the separable portion of filler material and second nanostructure together define a nanopellet having a length, width, and height, wherein the nanopellet has a height between approximately one μm and approximately 100 μms.

5. The device of claim 2 wherein the quantity of filler material further comprises a separable portion of filler material, the separable portion of filler material being disposed outside of the trench and apart from the substrate, the separable portion of filler material embedding and holding fixed therein a second nanostructure having a length approximately equal to the depth of the depth of the trench, wherein the separable portion of filler material and second nanostructure together define a nanopellet having a length, width, and height wherein the nanopellet has a side-wall angle of between approximately 90 degrees and approximately 54 degrees from a plane defined by a bottom of the nanopellet.

6. The device of claim 1 wherein the quantity of dielectric filler material comprises a spin on glass resin diluted by an ethyl acetate liquid.

7. The device of claim 1 wherein each of said at least one nanostructures is selected from the group consisting of a singlewall nanotube, a multiwall nanotube, a nanowire and a nanofiber.

8. The device of claim 1 wherein the device comprises a plurality of first nanostructures, at least a portion of the plurality of first nanostructures having a uniform length.

9. The device of claim 1 wherein the device comprises a plurality of first nanostructures, at least a portion of the plurality of first nanostructures having uniform alignment.

10. The device of claim 1 wherein the device comprises a plurality of first nanostructures, at least a portion of the plurality of first nanostructures having uniform spacing.

* * * * *

UNITED STATES PATENT AND TRADEMARK OFFICE
CERTIFICATE OF CORRECTION

PATENT NO. : 7,507,987 B2
APPLICATION NO. : 10/683511
DATED : March 24, 2009
INVENTOR(S) : Kim et al.

Page 1 of 1

It is certified that error appears in the above-identified patent and that said Letters Patent is hereby corrected as shown below:

Abstract lines 4 and 5, delete "nanostructures" and replace with --nanostructure--.

Column 6, line 2 delete "appropriate 210 and" and replace with --appropriate and--.

Column 6, line 7 delete "micron" and replace with --microns--.

Column 6, line 15 delete "sputtering.after" and replace with --sputtering after--.

Column 6, line 45 delete "temperature" and replace with --temperatures--.

Column 7, line 44 delete "has" and replace with --had--.

Column 7, line 63 delete ", near field" and replace with --, near-field--.

Column 8, lines 24-25 delete "nanostructure" and replace with --nanostructures--.

Column 8, line 54 delete the first instance of "the depth of".

Signed and Sealed this

Twenty-fourth Day of November, 2009

David J. Kappos
*Director of the United States Patent and Trademark Office*